(12) United States Patent
Yamaichi

(10) Patent No.: US 8,891,146 B2
(45) Date of Patent: Nov. 18, 2014

(54) HOLOGRAPHIC IMAGING

(75) Inventor: Eiji Yamaichi, Tokyo (JP)

(73) Assignee: Empire Technology Development LLC, Wilmington, DE (US)

( * ) Notice: Subject to any disclaimer, the term of this patent is extended or adjusted under 35 U.S.C. 154(b) by 0 days.

(21) Appl. No.: 13/881,731

(22) PCT Filed: Aug. 23, 2012

(86) PCT No.: PCT/US2012/051996
§ 371 (c)(1),
(2), (4) Date: Apr. 26, 2013

(87) PCT Pub. No.: WO2014/031117
PCT Pub. Date: Feb. 27, 2014

(65) Prior Publication Data
US 2014/0192389 A1   Jul. 10, 2014

(51) Int. Cl.
*G03H 1/22* (2006.01)
*G02B 5/32* (2006.01)
*G03H 1/00* (2006.01)
*H01L 33/00* (2010.01)

(52) U.S. Cl.
CPC ........... *G03H 1/2202* (2013.01); *G03H 1/2294* (2013.01); *H01L 33/0062* (2013.01)
USPC .................................. 359/32; 359/21; 359/34

(58) Field of Classification Search
None
See application file for complete search history.

(56) References Cited

U.S. PATENT DOCUMENTS

| 5,121,229 | A | 6/1992 | Benton et al. | |
| 2005/0270604 | A1* | 12/2005 | Drinkwater | 359/2 |
| 2011/0199660 | A1 | 8/2011 | Shirakura | |
| 2011/0216382 | A1 | 9/2011 | Koda et al. | |
| 2012/0002256 | A1* | 1/2012 | Lacoste et al. | 359/9 |
| 2012/0038959 | A1 | 2/2012 | Ciaudelli et al. | |

FOREIGN PATENT DOCUMENTS

| EP | 0772794 B1 | 7/2002 |
| JP | 06-282213 A | 10/1994 |
| KR | 10-2012-0010554 A | 2/2012 |
| KR | 10-2012-0046904 A | 5/2012 |

OTHER PUBLICATIONS

Notification of Transmittal of the International Search Report and the Written Opinion of the International Searching Authority, PCT/US2012/051996, Mar. 21, 2013.
Zane A. Coleman, "Modern Holographic Recording and Analysis Techniques Applied to Edge-lit Holograms and Their Applications", A Doctoral Thesis, Feb. 1997, pp. 1-226.

* cited by examiner

*Primary Examiner* — Jade R Chwasz
(74) *Attorney, Agent, or Firm* — Ren-Sheng International

(57) ABSTRACT

Technologies are generally described for generating an image in a holographic imaging device by causing multiple reflections of a hologram reconstruction light on one side of a display panel in the holographic imaging device. An example device may include a display panel, a semi-transparent mirror layer on the display panel, a mirror layer at a side of the semi-transparent mirror layer opposite to the display panel, and a light irradiation unit opposite to the semi-transparent mirror layer. The light irradiation unit may irradiate a hologram reconstruction light on the semi-transparent mirror layer at a predetermined incident angle. The semi-transparent mirror layer may reflect a portion of the hologram reconstruction light such that the reflected portion of the hologram reconstruction light may be incident on the mirror layer. The semi-transparent mirror layer may transmit the other portion of the hologram reconstruction light to cause interference in the hologram.

26 Claims, 9 Drawing Sheets

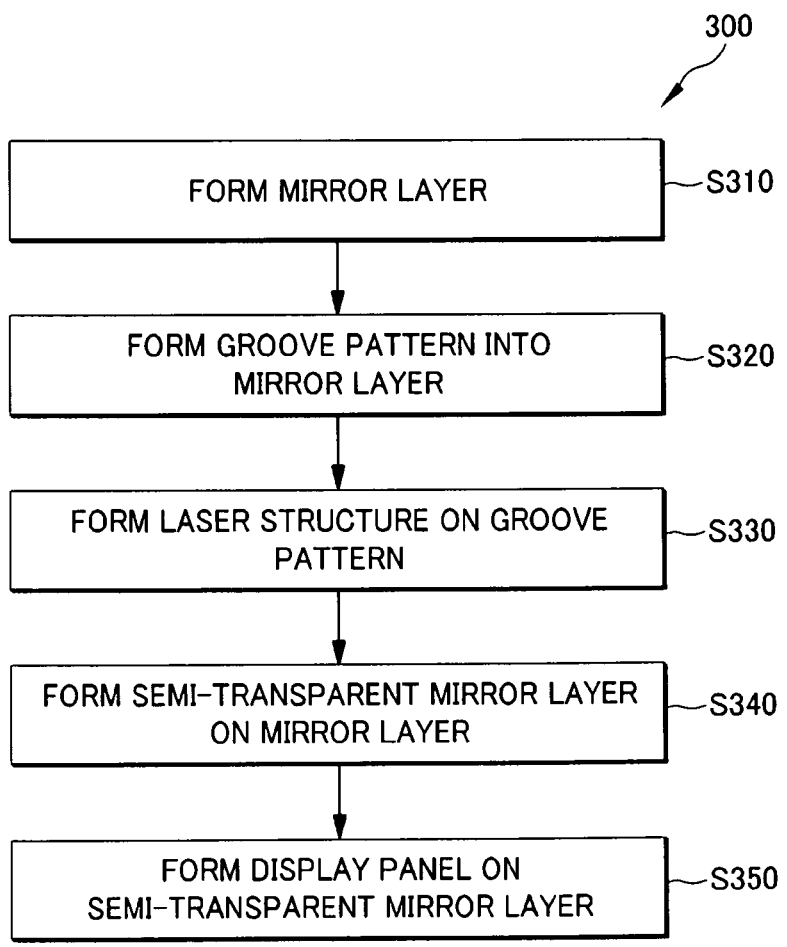

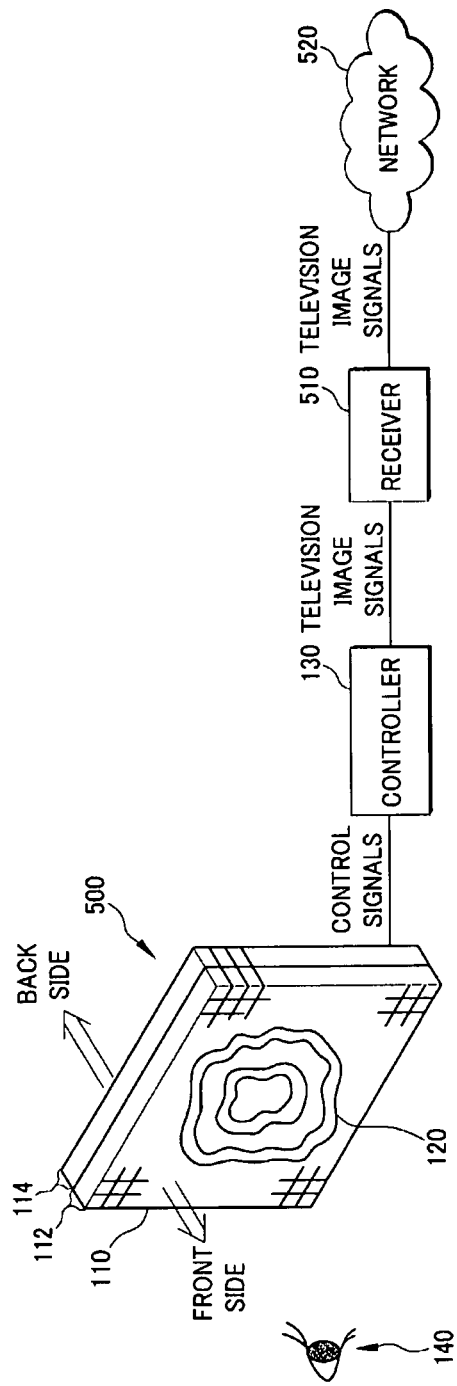

US 8,891,146 B2

HOLOGRAPHIC IMAGING

CROSS-REFERENCE TO RELATED APPLICATIONS

The present application is a 371 application of International Application PCT/US2012/051996, filed on Aug. 23, 2012 and entitled "HOLOGRAPHIC IMAGING." The International Application, including any appendices or attachments thereof, is incorporated by reference herein in its entirety.

BACKGROUND

Unless otherwise indicated herein, the approaches described in this section are not prior art to the claims in this application and are not admitted to be prior art by inclusion in this section.

Transmission-type holography techniques can be used to reproduce two-dimensional and three-dimensional images in a holographic television system. In such a holographic television system, a hologram can be displayed on a high-definition liquid crystal display panel constituted of pixels having a resolution of the order of the optical diffraction limit. The hologram may be formed based on fringe patterns contained in television image signals that can be transmitted through a television broadcast channel. In particular, the hologram can be formed by irradiating a reconstruction light that readily causes interference, e.g., coherent light emitted from a laser light source, on the fringe patterns displayed on one side of the display panel. The irradiation of the reconstruction light on the fringe patterns causes diffraction in the fringe patterns, such that a user can observe the diffracted light as holographic images emitted from the other side of the display panel.

In the above-described transmission-type holographic television system, a reconstruction light is required to be irradiated from one side of the display panel. Such configuration may limit the reduction in the thickness of the display panel and thus restrict this technique to apply to small-sized mobile electronic devices such as, for example, mobile phones or tablet computers.

SUMMARY

Technologies are generally described for generating an image in a holographic imaging device by causing multiple reflections of a hologram reconstruction light on one side of a display panel in the holographic imaging device.

Various example apparatus or devices described herein may include a display panel, a semi-transparent mirror layer, a mirror layer, and a light irradiation unit. The display panel may be configured to display a hologram. The semi-transparent mirror layer may be disposed on the display panel, and the mirror layer may be disposed at a side of the semi-transparent mirror layer opposite to the display panel. The light irradiation unit may be configured to irradiate a hologram reconstruction light to be incident on a side of the semi-transparent mirror layer opposite to the display panel at a predetermined incident angle. Further, the semi-transparent mirror layer may be configured to reflect a portion of the hologram reconstruction light such that the reflected portion of the hologram reconstruction light may be incident on the mirror layer. In the meantime, the semi-transparent mirror layer may be configured to transmit the other portion of the hologram reconstruction light effective to cause interference in the hologram displayed in the display panel.

In some examples, methods for generating an image are described, where the methods may be performed by a holographic imaging device described herein. The example methods may include irradiating, by a light irradiation unit, a hologram reconstruction light on a side of a semi-transparent mirror layer opposite to a display panel at a predetermined incident angle. A portion of the hologram reconstruction light may be reflected on the semi-transparent mirror layer such that the reflected portion of the hologram reconstruction light may be incident on the mirror layer. In the methods, another portion of the hologram reconstruction light may be transmitted through the semi-transparent mirror layer effective to cause interference in the hologram displayed in the display panel.

In some examples, methods for fabricating a holographic-imaging device are described. The example methods may include forming a mirror layer, forming a groove pattern into the mirror layer, forming a laser structure on the groove pattern, forming a semi-transparent mirror layer on the mirror layer, and forming a display panel on the semi-transparent mirror layer.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 3 illustrates an example flow diagram of a method adapted to fabricate a holographic imaging device;

FIG. 5 schematically shows an illustrative example holographic television apparatus including a receiving unit;

DETAILED DESCRIPTION

Figure 1:
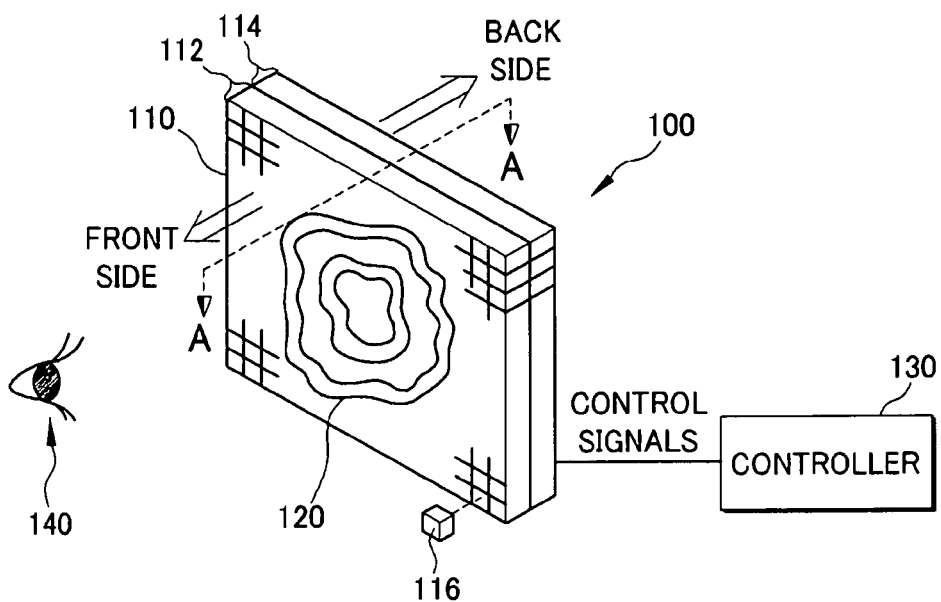
FIG. 1 schematically shows an illustrative example holographic television apparatus.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to methods, apparatus, systems, devices, and computer program products related to generating an image in a holographic imaging device by causing multiple reflections of a hologram reconstruction light on one side of a display panel in the holographic imaging device.

Briefly stated, technologies are generally described for generating an image by irradiating a hologram reconstruction light on one side of a display panel in a holographic imaging devices or a television apparatus configured to display two-dimensional or three-dimensional holographic images. Example holographic imaging devices may be configured to irradiate a hologram reconstruction light to be incident on a side of a semi-transparent mirror layer on a display panel at a predetermined incident angle. The semi-transparent mirror layer may be configured to reflect a portion of the hologram reconstruction light such that the reflected portion of the hologram reconstruction light may be incident on a mirror layer at a side of the semi-transparent mirror layer opposite to the display panel. Further, the semi-transparent mirror layer may be configured to transmit the other portion of the hologram reconstruction light to cause interference in a hologram displayed in the display panel. In various examples described herein, a "semi-transparent" mirror layer may refer to any type of half-reflective layer, on which at least a portion of light may be reflected while an other portion of light may be transmitted therethrough.

In some embodiments, the mirror layer may include an aluminum film coated on a glass layer or a silicon dioxide film formed on a silicon layer. Further, the semi-transparent mirror layer may include an aluminum film coated on a glass layer or an aluminum film coated on the display panel. The mirror layer may be configured to be spaced apart from the semi-transparent mirror layer by a predetermined gap, where the gap may be filled with air or quartz glass. In this configuration, the incident angle of the hologram reconstruction light may be adjusted such that an optical path length of the hologram reconstruction light in the gap may be an integer multiple of a wavelength of the hologram reconstruction light.

In some other embodiments, the semi-transparent mirror layer may be made of quartz glass, and a side of the display panel facing the semi-transparent mirror layer may include a glass layer, where a refractive index of the semi-transparent mirror layer may be greater than a refractive index of the glass layer of the display panel. In this configuration, the incident angle of the hologram reconstruction light may be adjusted to prevent a total reflection of the hologram reconstruction light between the semi-transparent mirror layer and the glass layer of the display panel.

FIG. 1 schematically shows an illustrative example holographic television apparatus 100 that is arranged in accordance with at least some embodiments described herein. Holographic television apparatus 100 is configured to generate holographic images by irradiating a hologram reconstruction light on one side of a display panel.

As depicted, holographic television apparatus 100 may include a holographic imaging device 110, and a controller 130 coupled to holographic imaging device 110. Holographic imaging device 110 may be configured to generate a hologram 120 represented by fringe patterns. By irradiating a hologram reconstruction light from a light source (not shown) on a back side of holographic imaging device 110 on which hologram 120 is displayed, interference in hologram 120 may be caused, such that an observer 140 can watch a reconstructed holographic image.

In some embodiments, controller 130 may be configured to receive television image signals and generate control signals based on the received television image signals. The control signals may be provided to holographic imaging device 110 to control the generation of hologram 120 and the irradiation of the hologram reconstruction light.

In some embodiments, holographic imaging device 110 may include a display panel 112 and a multiple-reflection layer 114. For example, display panel 112 may include a two-dimensional (2D) matrix of liquid crystal display (LCD) elements, each of which 116 may be configured to generate at least a portion of hologram 120. Multiple-reflection layer 114 may include a semi-transparent mirror layer disposed on a back side of display panel 112, and a mirror layer disposed at a back side of the semi-transparent mirror layer opposite to display panel 112, which will be described below in detail.

Figure 2:
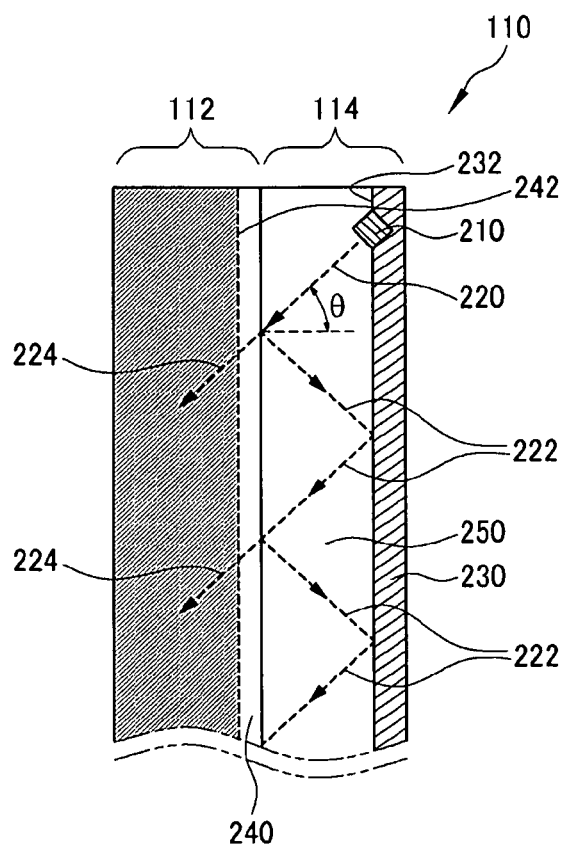
FIG. 2 schematically shows a cross-sectional view of an illustrative example holographic imaging device.

FIG. 2 schematically shows a cross-sectional view of an illustrative example holographic imaging device 110 that is arranged in accordance with at least some embodiments described herein. The perspective view for FIG. 2 is taken along the line A-A as indicated in FIG. 1.

As shown in FIG. 2, multiple-reflection layer 114 may include a mirror layer 230 disposed to be spaced apart from one side (e.g., back side) of display panel 112. Mirror layer 230 may include a reflective material such as aluminum film coated on a glass layer. Alternatively, mirror layer 230 may include a silicon dioxide film formed on a silicon layer. On a front side 232 of mirror layer 230, a light irradiation unit 210 may be disposed such that light irradiate unit 210 may irradiate hologram reconstruction light 220 on a back side 242 of display panel 112 at a predetermined incident angle. Irradiation of hologram reconstruction light 220 from light irradiation unit 210 may be controlled based on a control signal from control unit 130. Light irradiation unit 210 may include at least one light source configured to emit a coherent beam, e.g., a laser beam source.

In some embodiments, light irradiation unit 210 may be implemented using a semiconductor laser device. For example, light irradiation unit 210 may include any type of laser diode known in the art, such as a GaAs/AlGaAs laser diode. In some examples, a semiconductor laser device may be implemented using a double hetero-structure including several layers that have different functions. In this double hetero-structure, an active or light amplification layer may be sandwiched between two cladding layers, which may provide injection of electrons into the active layer. Because the active layer has a refractive index larger than those of the cladding layers, light may be confined in the active layer and emitted from an emitting end face arranged in a direction parallel to a plane of the active layer.

Hologram reconstruction light 220 emitted from light irradiation unit 210 may be incident on one side (e.g., a back side) of display panel 112 at a predetermined angle. In some embodiments, a semi-transparent mirror layer 240 may be disposed on back side 242 of display panel 112, where the light from light irradiation unit 210 may be incident on the semi-transparent mirror layer 240. Semi-transparent mirror layer 240 may include an aluminum film coated on a glass layer. Alternatively, semi-transparent mirror layer 240 may include an aluminum film, which may be directly coated on the back side 242 of display panel 112.

In some embodiments, semi-transparent mirror layer 240 may be configured to reflect a portion of hologram reconstruction light 220 such that the reflected portion of hologram reconstruction light 220 may be incident on mirror layer 230. In the meantime, semi-transparent mirror layer 240 may be configured to transmit the other portion of hologram reconstruction light 220 such that interference may be caused in hologram 120 displayed in display panel 112. In this manner, at least a portion of hologram reconstruction light 220 from light irradiation unit 210 may be reflected in multiple times between mirror layer 230 and semi-transparent mirror layer 240 or the back side 242 of display panel 112, such that the reflected portion of hologram reconstruction light 220 may be propagated until it reaches the lower end side of multiple-reflection layer 114.

As illustrated in FIG. 2, mirror layer 230 may be arranged to be spaced apart from the back side 242 of display panel 112 (or semi-transparent mirror layer 240) by a gap 250. In some embodiments, gap 250 between mirror layer 230 and the back side 242 of display panel 112 may be filled with air. Alternatively, gap 250 between mirror layer 230 and the back side 242 of display panel 112 may be filled with quartz glass material. In some cases, if the back side 242 of display panel 112 facing the quartz glass material includes a glass layer, a refractive index of the quartz glass material may be set to be less than a refractive index of the glass layer of display panel 112. In this manner, a total reflection of the hologram reconstruction light between the quartz glass material and the glass layer of display panel 112 may be prevented.

Additionally and/or alternatively, an incident angle θ of the hologram reconstruction light from light irradiation unit 210 to the back side 242 of display panel 112 (or semi-transparent mirror layer 240) may be selected to prevent a total reflection of the hologram reconstruction light between the quartz glass material and the glass layer of display panel 112. In some embodiments, incident angle θ of the hologram reconstruction light from light irradiation unit 210 may be adjusted such that an optical path length of the hologram reconstruction light in gap 250 may be an integer multiple of a wavelength of the hologram reconstruction light.

As described above, at least a portion 222 of the hologram reconstruction light from light irradiation unit 210 may be propagated through gap 250 by being reflected in multiple times between mirror layer 230 and the back side 242 of display panel 112. In some instances, during the propagation of the hologram reconstruction light 222 through gap 250, the intensity of the hologram reconstruction light 222 may be gradually attenuated because at least a portion 224 of the hologram reconstruction light reflected on mirror layer 230 may be transmitted through display panel 112 (or semi-transparent mirror layer 240). To reduce such attenuation of the hologram reconstruction light, the back side 242 of display panel 112 may include a material adapted to intensify the light, such as quartz glass material or dielectric material doped with rare-earth material.

FIG. 3 illustrates an example flow diagram of a method adapted to fabricate a holographic imaging device, accordance with at least some embodiments described herein. An example method 300 illustrated in FIG. 3 may be implemented using, for example, a computing device including a processor adapted to control a semiconductor manufacturing equipment or display panel manufacturing equipment.

Method 300 may include one or more operations, actions, or functions as illustrated by one or more of blocks S310, S320, S330, S340 and/or S350. Although illustrated as discrete blocks, various blocks may be divided into additional blocks, combined into fewer blocks, or eliminated, depending on the desired implementation. In some further examples, the various described blocks may be implemented as a parallel process instead of a sequential process, or as a combination thereof.

FIGS. 4A to 4F schematically show an example process for fabricating a hologram imaging device, arranged in accordance with at least some embodiments described herein. The details of FIGS. 4A through 4F will be discussed below in conjunction with method 300 from FIG. 3. Method 300 may begin at block S310, "FORM MIRROR LAYER."

Figure 4A:
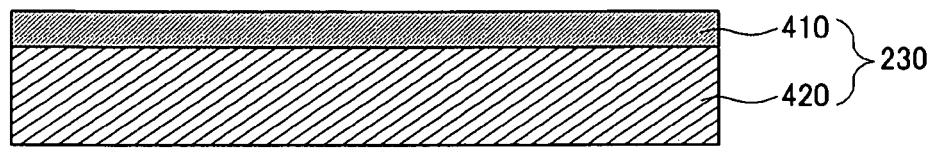
FIGS. 4A to 4F schematically show an example process for fabricating a hologram imaging device.

At block S310, a mirror layer may be formed. An example mirror layer formation is illustrated by FIG. 4A, where a mirror layer 230 may include a silicon dioxide ($SiO_2$) layer 410 deposited on a silicon substrate 420. Alternatively, mirror layer 230 may include an aluminum layer 410 coated on a glass layer 420. Block S310 may be followed by block S320, "FORM GROOVE PATTERN INTO MIRROR LAYER."

Figure 4B:
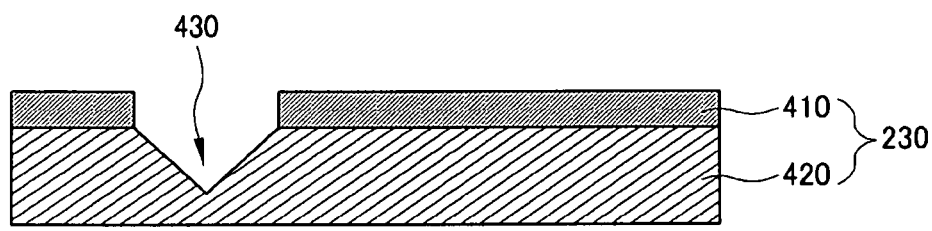

At block S320, a groove pattern may be formed into the mirror layer. An example groove pattern formation is illustrated by FIG. 4B, where a groove pattern 430 such as a wedge-shaped pattern may be formed into mirror layer 230 by etching the top surface of mirror layer 230. In some embodiments, groove pattern 430 may be formed into mirror layer 230 by performing an anisotropic etching method. Block S320 may be followed by block S330, "FORM LASER STRUCTURE ON GROOVE PATTERN."

Figure 4C:
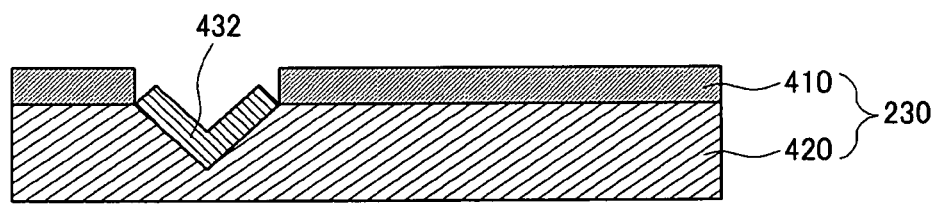
Figure 4D:
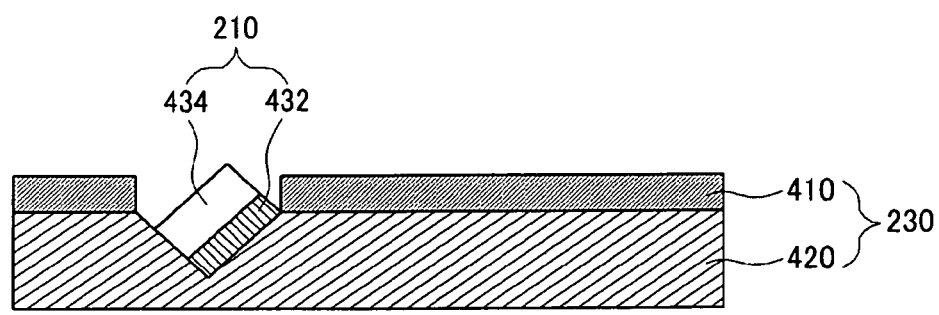

At block S330, a laser structure may be formed on the groove pattern in the mirror layer. By way of example, but not limitation, the laser structure may include any type of laser diode structure known in the art, such as a GaAs/AlGaAs laser diode. An example laser diode structure formation is illustrated by FIG. 4C and FIG. 4D, where a substrate 432 made of GaAs or GaN may be formed in groove pattern 430, and a laser structure 434, which may include a first conductive type cladding layer, an active layer and a second conductive type cladding layer, may be formed using an AlGaAs or GaN based material. In some embodiments, substrate 432 and laser structure 434 may form light irradiation unit 210. Block S330 may be followed by block S340, "FORM SEMI-TRANSPARENT MIRROR LAYER ON MIRROR LAYER."

Figure 4E:
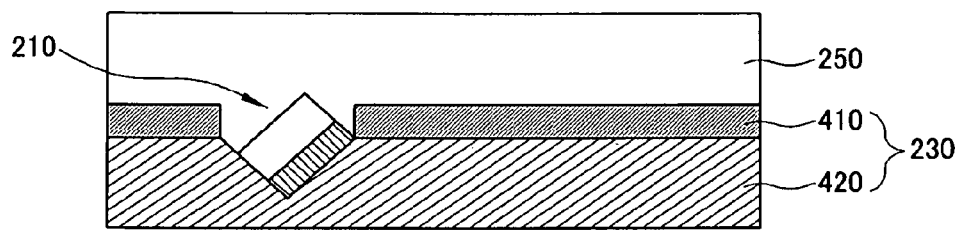

At block S340, a semi-transparent mirror layer may be formed on the mirror layer. An example semi-transparent mirror layer formation is illustrated by FIG. 4E, where a quartz glass material 250 may be formed on a mirror layer 230, in the groove pattern of which light irradiation unit 210 may be formed. In some embodiments, quartz glass material 250 may serve as the semi-transparent mirror layer. Additionally, another layer 240 made of reflective material such as aluminum, which may serve as the semi-transparent mirror layer, may be formed on quartz glass material 250. Block S340 may be followed by block S350, "FORM DISPLAY PANEL ON SEMI-TRANSPARENT MIRROR LAYER."

Figure 4F:
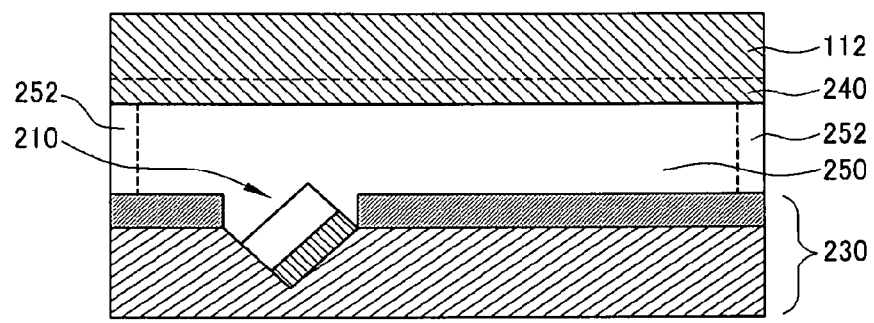

At block S350, a display panel may be formed on the semi-transparent mirror layer. An example display panel formation is illustrated by FIG. 4F, where a display panel 112 such as LCD display panel may be attached to quartz glass material 250. As described above, in some embodiments, display panel 112 may include semi-transparent mirror layer 240 formed on one side (e.g., a bottom side of display panel 112.

In the above embodiments, quartz glass material may be filled in gap 250 between mirror layer 230 and the bottom side of display panel 112 (or semi-transparent mirror layer 240). In alternative embodiments, gap 250 between mirror layer 230 and the bottom side of display panel 112 may be filled with air. Further, other transparent materials such as, but not limitation, glass or other gasses such as, but not limitation, nitrogen may be advantageous for filling gap 250. In such cases, at block S350, support pillars 252 (see FIG. 4F) may be formed on mirror layer 230, and display panel 112 may be attached to support pillars 252 such that mirror layer 230 may be spaced apart from display panel 112 by a predetermined gap (as indicated by 250).

FIG. 5 schematically shows an illustrative example holographic television apparatus 500 including a receiving unit, arranged in accordance with at least some embodiments described herein. Holographic television apparatus 500 may have a similar configuration to holographic television apparatus 100 in FIG. 1 except that holographic television apparatus 500 may further include a receiver 510. In FIG. 5, similar elements to those shown in FIG. 1 are indicated with similar reference numerals, and thus a description thereof will be omitted for the sake of simplicity.

As depicted, holographic television apparatus 500 may include holographic imaging device 110, controller 130, and receiver 510. Holographic imaging device 110 may be coupled to controller 130, where the controller 130 is also couple to the receiver 510. Holographic imaging device 110 may be configured to generate hologram 120 represented by fringe patterns. In particular, by irradiating a hologram reconstruction light from a light source (not shown) on a back side of holographic imaging device 110 on which hologram 120 is displayed, interference in hologram 120 may be caused, such that observer 140 can watch a reconstructed holographic image.

In some embodiments, holographic imaging device 110 may include display panel 112 and multiple-reflection layer 114. For example, display panel 112 may include a two-dimensional (2D) matrix of LCD elements, each of which may be configured to generate at least a portion of hologram 120. Controller 130 may be configured to receive television image signals from receiver 510. The television image signals may be encoded with any suitable encoding techniques into particular formats including, but not limited to, NTSC/PAL analog signals, RGB, 4fSC composite digital signals or 4:2:2 component signals. Control signals may then be extracted from the television image signals and provided to holographic imaging device 110 to control the generation of hologram 120 and the irradiation of the hologram reconstruction light.

In some embodiments, receiver 510 may be configured to receive the television image signals through a network 520. For example, network 520 may be any suitable television broadcasting network including, but not limited to, a cable broadcasting network, a terrestrial broadcasting network and a satellite broadcasting network. In some embodiments, receiver 510 may receive television image signals that may be compressed or scrambled using any suitable image encoding/compression techniques. In such cases, receiver 510 may be further configured to decompress or descramble the compressed signals to reconstruct the original television image signals.

Figure 6:
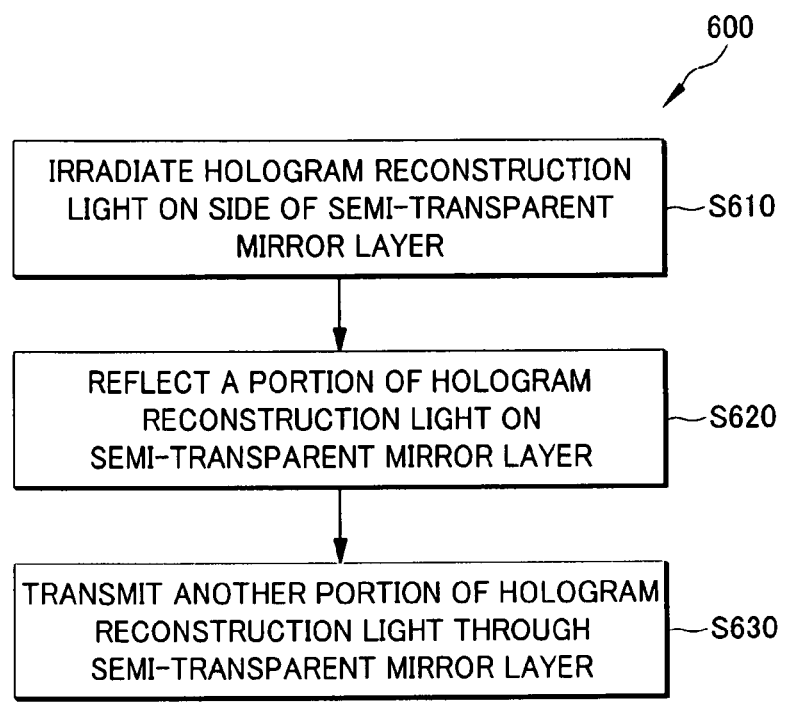
FIG. 6 shows an example flow diagram of a method adapted to generate holographic images in a holographic imaging device.

FIG. 6 shows an example flow diagram of a method adapted to generate holographic images in a holographic imaging device arranged in accordance with at least some embodiments described herein. An example method 600 in FIG. 6 may be implemented using, for example, a computing device including a processor adapted to control a holographic imaging device to generate holographic images.

Method 600 may include one or more operations, actions, or functions as illustrated by one or more of blocks. S610, S620 and/or S630. Although illustrated as discrete blocks, various blocks may be divided into additional blocks, combined into fewer blocks, or eliminated, depending on the desired implementation. In some further examples, the various described blocks may be implemented as a parallel process instead of a sequential process, or as a combination thereof. Method 600 may begin at block S610, "IRRADIATE HOLOGRAM RECONSTRUCTION LIGHT ON SIDE OF SEMI-TRANSPARENT MIRROR LAYER."

At block S610, a light irradiation unit of a holographic imaging device may irradiate a hologram reconstruction light on a side of a semi-transparent mirror layer. For Example, light irradiation unit 210 of holographic imaging device 110 as shown in FIG. 2 may be configured to irradiate a hologram reconstruction light on a side of semi-transparent mirror layer 240 opposite to display panel 112 at a predetermined incident angle. Block S610 may be followed by block S620, "REFLECT A PORTION OF HOLOGRAM RECONSTRUCTION LIGHT ON SEMI-TRANSPARENT MIRROR LAYER."

At block S620, a portion of the hologram reconstruction light may be reflected on the semi-transparent mirror layer and incident on a mirror layer. For example, as shown in FIG. 2, semi-transparent mirror layer 240 may be configured to reflect a portion of hologram reconstruction light 220 such that the reflected portion of hologram reconstruction light 220 may be incident on mirror layer 230. Block S620 may be followed by block S630, "TRANSMIT ANOTHER PORTION OF HOLOGRAM RECONSTRUCTION LIGHT THROUGH SEMI-TRANSPARENT MIRROR LAYER."

At block S630, another portion of the hologram reconstruction light may be transmitted through the semi-transparent mirror layer. For example, as shown in FIG. 2, semi-transparent mirror layer 240 may be configured to transmit the other portion of hologram reconstruction light 220 to cause interference in hologram 120 displayed in display panel 112. In this manner, at least a portion of hologram reconstruction light 220 from light irradiation unit 210 may be reflected in multiple times between mirror layer 230 and semi-transparent mirror layer 240 or the back side 242 of display panel 112. In this way, the reflected portion of hologram reconstruction light 220 may be propagated until it reaches the lower end side of multiple-reflection layer 114.

One skilled in the art will appreciate that, for this and other methods disclosed herein, the functions performed in the methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

Figure 7:
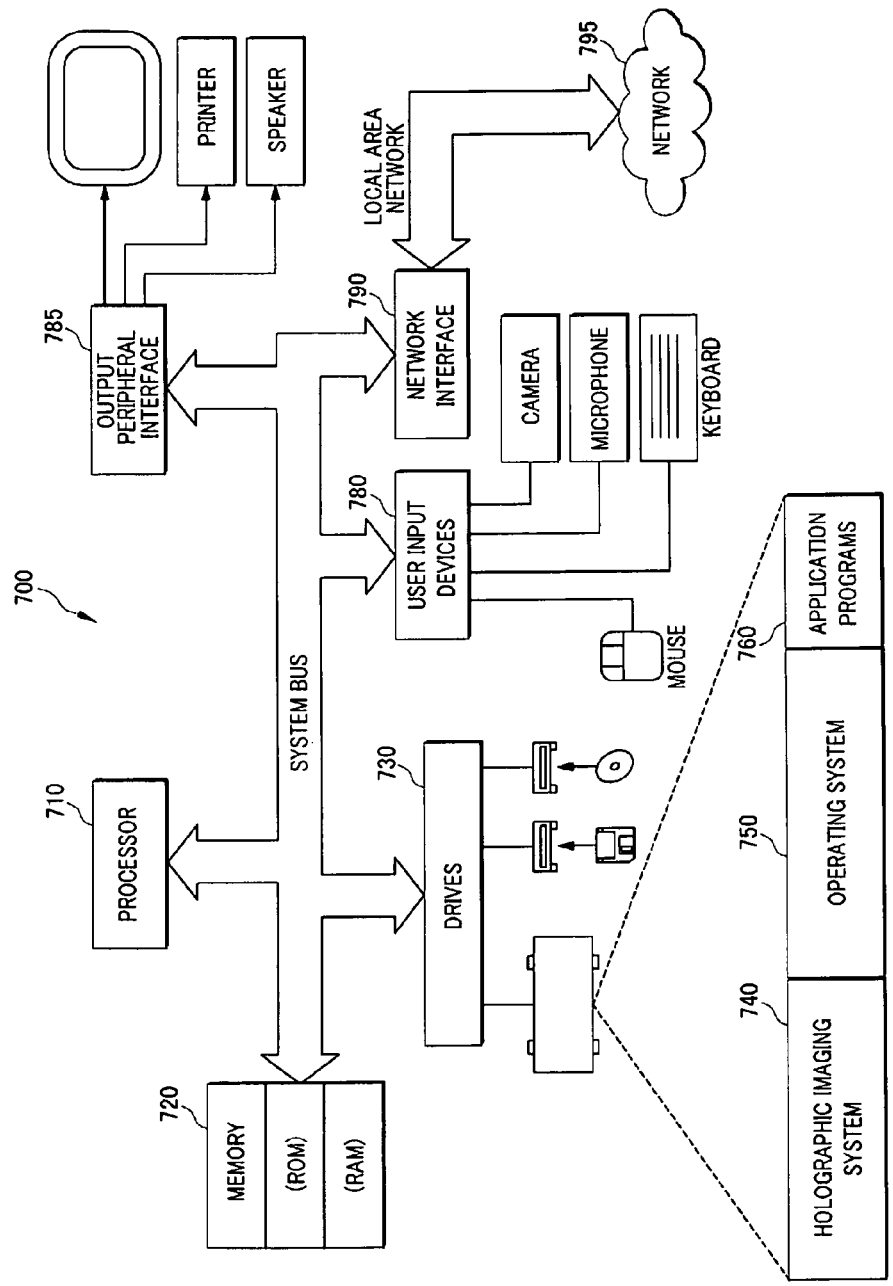
FIG. 7 shows a schematic block diagram illustrating an example computing system that may be configured to perform a method for generating holographic images in a holographic imaging device.

FIG. 7 shows a schematic block diagram illustrating an example computing system that may be configured to operate a holographic imaging device or a holographic television apparatus arranged in accordance with at least some embodiments described herein. As depicted in FIG. 7, a computer 700 may include a processor 710, a memory 720 and one or more drives 730. Computer 700 may be implemented as a conventional computer system, an embedded control computer, a laptop, or a server computer, a mobile device, a set-top box, a kiosk, a vehicular information system, a mobile telephone, a customized machine, or other hardware platform.

Drives 730 and their associated computer storage media may provide storage of computer readable instructions, data structures, program modules and other data for computer 700. Drives 730 may include a holographic imaging system 740, an operating system (OS) 750, and application programs 760. Holographic imaging system 740 may be adapted to control the holographic television apparatus to generate holographic images. Additionally, holographic imaging system 740 may be adapted to control the holographic imaging device or holographic television apparatus in such a manner as described above with respect to FIGS. 1, 2, 5 and 6.

Computer 700 may further include user input devices 780 through which a user may enter commands and data. Input devices may include an electronic digitizer, a camera, a microphone, a keyboard and pointing device, commonly referred to as a mouse, trackball or touch pad. Other input devices may include a joystick, game pad, satellite dish, scanner, or the like.

These and other input devices may be coupled to processor 710 through a user input interface that is coupled to a system bus, but may be coupled by other interface and bus structures, such as a parallel port, game port or a universal serial bus (USB). Computers such as computer 700 may also include other peripheral output devices such as display devices, which may be coupled through an output peripheral interface 785 or the like.

Computer 700 may operate in a networked environment using logical connections to one or more computers, such as a remote computer coupled to a network interface 790. The remote computer may be a personal computer, a server, a router, a network PC, a peer device or other common network node, and may include many or all of the elements described above relative to computer 700.

Networking environments are commonplace in offices, enterprise-wide area networks (WAN), local area networks (LAN), intranets, and the Internet. When used in a LAN or WLAN networking environment, computer 700 may be coupled to the LAN through network interface 790 or an adapter. When used in a WAN networking environment, computer 700 typically includes a modem or other means for establishing communications over the WAN, such as the Internet or a network 795. The WAN may include the Internet, the illustrated network 795, various other networks, or any combination thereof. It will be appreciated that other mechanisms of establishing a communications link, ring, mesh, bus, cloud, or network between the computers may be used.

In some embodiments, computer 700 may be coupled to a networking environment. Computer 700 may include one or more instances of a physical computer-readable storage medium or media associated with drives 730 or other storage devices. The system bus may enable processor 710 to read code and/or data to/from the computer-readable storage media. The media may represent an apparatus in the form of storage elements that are implemented using any suitable technology, including but not limited to semiconductors, magnetic materials, optical media, electrical storage, electrochemical storage, or any other such storage technology. The media may represent components associated with memory 720, whether characterized as RAM, ROM, flash, or other types of volatile or nonvolatile memory technology. The media may also represent secondary storage, whether implemented as storage drives 730 or otherwise. Hard drive implementations may be characterized as solid state, or may include rotating media storing magnetically encoded information.

Processor 710 may be constructed from any number of transistors or other circuit elements, which may individually or collectively assume any number of states. More specifically, processor 710 may operate as a state machine or finite-state machine. Such a machine may be transformed to a second machine, or specific machine by loading executable instructions. These computer-executable instructions may transform processor 710 by specifying how processor 710 transitions between states, thereby transforming the transistors or other circuit elements constituting processor 710 from a first machine to a second machine. The states of either machine may also be transformed by receiving input from user input devices 780, network interface 790, other peripherals, other interfaces, or one or more users or other actors. Either machine may also transform states, or various physical characteristics of various output devices such as printers, speakers, video displays, or otherwise.

Figure 8:
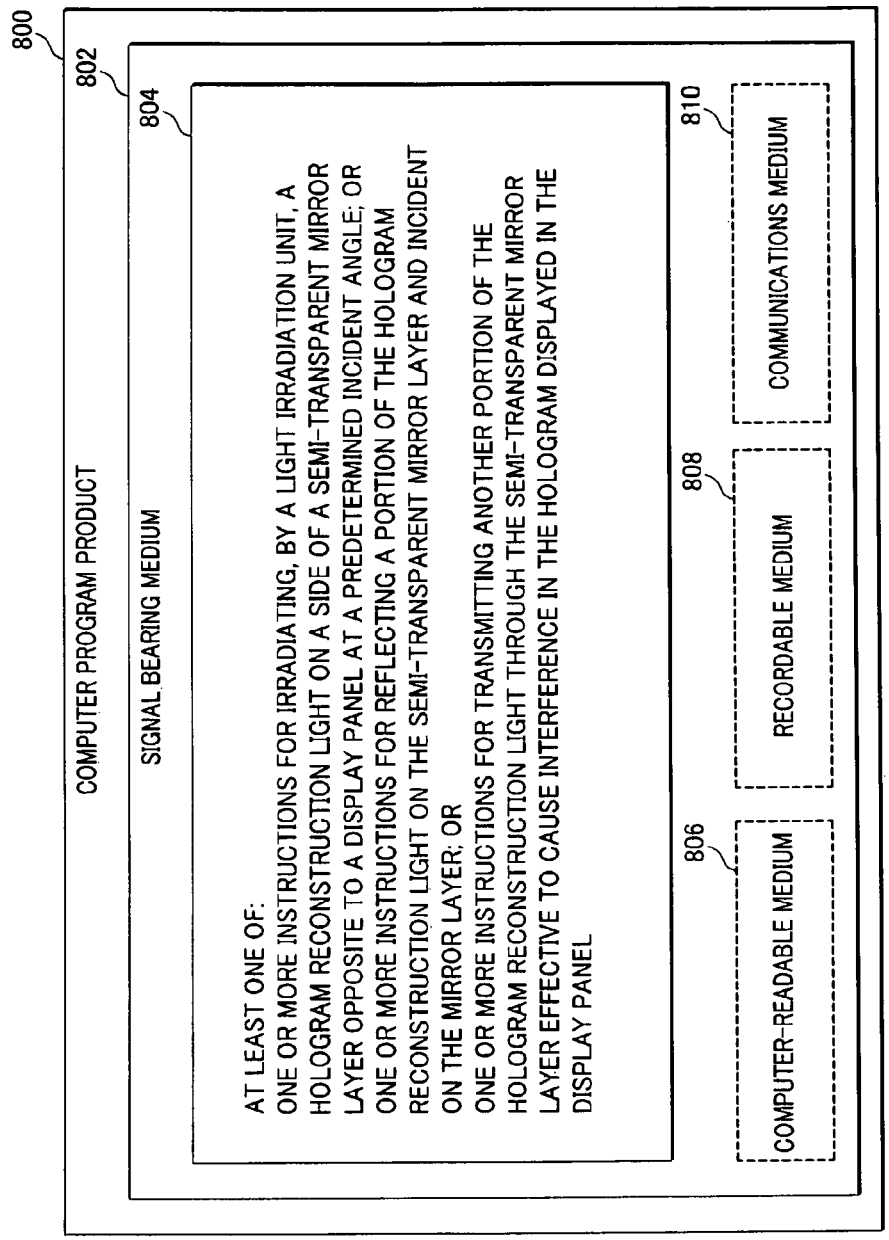
FIG. 8 illustrates computer program products that may be utilized to generate holographic images in a holographic imaging device, all arranged in accordance with at least some embodiments described herein.

FIG. 8 illustrates computer program products 800 that may be utilized to operate a holographic imaging device or a holographic television apparatus in accordance with at least some embodiments described herein. Program product 800 may include a signal bearing medium 802. Signal bearing medium 802 may include one or more instructions 804 that, when executed by, for example, a processor, may provide the functionality described above with respect to FIGS. 1, 2, 5 and 6. By way of example, instructions 804 may include: one or more instructions for irradiating, by a light irradiation unit, a hologram reconstruction light on a side of a semi-transparent mirror layer opposite to a display panel at a predetermined incident angle; one or more instructions for reflecting a portion of the hologram reconstruction light on the semi-transparent mirror layer and incident on the mirror layer; or one or more instructions for transmitting another portion of the hologram reconstruction light through the semi-transparent mirror layer effective to cause interference in the hologram displayed in the display panel. Thus, for example, referring to FIGS. 1, 2, 5 and 6, holographic television apparatus 100 or 500 or holographic imaging device 110 may undertake one or more of the blocks shown in FIG. 6 in response to instructions 804.

In some implementations, signal bearing medium 802 may encompass a computer-readable medium 806, such as, but not limited to, a hard disk drive, a Compact Disc (CD), a Digital Video Disk (DVD), a digital tape, memory, etc. In some implementations, signal bearing medium 802 may encompass a recordable medium 808, such as, but not limited to, memory, read/write (R/W) CDs, R/W DVDs, etc. In some implementations, signal bearing medium 802 may encompass a communications medium 810, such as, but not limited to, a digital and/or an analog communication medium (e.g., a fiber optic cable, a waveguide, a wired communications link, a wireless communication link, etc.). Thus, for example, program product 800 may be conveyed to one or more modules of holographic television apparatus 100 or 500 by an RF signal bearing medium 802, where signal bearing medium 802 is conveyed by a wireless communications medium 810 (e.g., a wireless communications medium conforming with the IEEE 802.11 standard).

The present disclosure is not to be limited in terms of the particular embodiments described in this application, which are intended as illustrations of various aspects. Many modifications and variations may be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

The herein described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A holographic imaging device, comprising:
   a display panel configured to display a hologram;
   a semi-transparent mirror layer disposed on the display panel;
   a mirror layer disposed at a side of the semi-transparent mirror layer opposite to the display panel; and
   a light irradiation unit configured to irradiate a hologram reconstruction light to be incident on the side of the semi-transparent mirror layer opposite to the display panel at a specific incident angle,
   wherein the semi-transparent mirror layer is configured to reflect a portion of the hologram reconstruction light such that the reflected portion of the hologram reconstruction light is incident on the mirror layer, and the semi-transparent mirror layer is configured to transmit another portion of the hologram reconstruction light effective to cause interference in the hologram displayed by the display panel.

2. The holographic imaging device of claim 1, wherein the light irradiation unit includes at least one laser beam source.

3. The holographic imaging device of claim 1, wherein the display panel includes a liquid crystal display panel.

4. The holographic imaging device of claim 1, wherein the mirror layer includes an aluminum film coated on a glass layer.

5. The holographic imaging device of claim 1, wherein the mirror layer includes a silicon dioxide film formed on a silicon layer.

6. The holographic imaging device of claim 1, wherein the semi-transparent mirror layer includes an aluminum film coated on a glass layer.

7. The holographic imaging device of claim 1, wherein the semi-transparent mirror layer includes an aluminum film coated on the display panel.

8. The holographic imaging device of claim 1, wherein the mirror layer is spaced apart from the semi-transparent mirror layer by a specific gap.

9. The holographic imaging device of claim 8, wherein the gap between the mirror layer and the semi-transparent mirror layer is filled with air.

10. The holographic imaging device of claim 8, wherein the gap between the mirror layer and the semi-transparent mirror layer is filled with quartz glass.

11. The holographic imaging device of claim 8, wherein the incident angle of the hologram reconstruction light is adjusted such that an optical path length of the hologram reconstruction light in the gap is an integer multiple of a wavelength of the hologram reconstruction light.

12. The holographic imaging device of claim 1, wherein the semi-transparent mirror layer is made of quartz glass,
wherein a side of the display panel that faces the semi-transparent mirror layer includes a glass layer, and
wherein a refractive index of the semi-transparent mirror layer is greater than a refractive index of the glass layer of the display panel.

13. The holographic imaging device of claim 12, wherein the incident angle of the hologram reconstruction light is selected to prevent a total reflection of the hologram reconstruction light between the semi-transparent mirror layer and the glass layer of the display panel.

14. The holographic imaging device of claim 1, wherein the semi-transparent mirror layer is doped with rare-earth material.

15. A method to generate an image in a holographic imaging device including a display panel configured to display a hologram, a semi-transparent mirror layer disposed on the display panel, and a mirror layer disposed at a side of the semi-transparent mirror layer opposite to the display panel, the method comprising:
irradiating, by a light irradiation unit, a hologram reconstruction light on the side of the semi-transparent mirror layer opposite to the display panel at a specific incident angle;
reflecting a portion of the hologram reconstruction light on the semi-transparent mirror layer such that the reflected portion of the hologram reconstruction light is incident on the mirror layer; and
transmitting another portion of the hologram reconstruction light through the semi-transparent mirror layer effective to cause interference in the hologram displayed by the display panel.

16. The method of claim 15, further comprising:
adjusting, by the light irradiation unit, the incident angle of the hologram reconstruction light such that an optical path length of the hologram reconstruction light in a specific gap is an integer multiple of a wavelength of the hologram reconstruction light.

17. The method of claim 15, further comprising:
adjusting, by the light irradiation unit, the incident angle of the hologram reconstruction light effective to prevent a total reflection of the hologram reconstruction light between the semi-transparent mirror layer and a side of the display panel, wherein the side of the display panel includes a material with a refractive index less than a refractive index of the semi-transparent mirror layer.

18. An apparatus, comprising:
a display panel configured to display a hologram;
a semi-transparent mirror layer disposed on the display panel; and
a mirror layer disposed at a side of the semi-transparent mirror layer opposite to the display panel;
wherein the side of the semi-transparent mirror layer opposite to the display panel is positioned to be irradiated by, at a specific incident angle, a hologram reconstruction light, and
wherein the semi-transparent mirror layer is configured to return a portion of the hologram reconstruction light such that the returned portion of the hologram reconstruction light is incident on the mirror layer, and the semi-transparent mirror layer is configured to transmit another portion of the hologram reconstruction light effective to cause interference in the hologram displayed by the display panel.

19. The apparatus of claim 18, wherein the display panel includes a liquid crystal display panel.

20. The apparatus of claim 18, wherein the mirror layer includes an aluminum film coated on a glass layer, or a silicon dioxide film formed on a silicon layer.

21. The apparatus of claim 18, wherein the semi-transparent mirror layer includes an aluminum film coated on a glass layer, or an aluminum film coated on the display panel.

22. The apparatus of claim 18, wherein the mirror layer is spaced apart from the semi-transparent mirror layer by a specific gap.

23. The apparatus of claim 22, wherein the gap between the mirror layer and the semi-transparent mirror layer is filled with air or is filled with quartz glass.

24. The apparatus of claim 18, wherein the semi-transparent mirror layer is made of quartz glass,
wherein a side of the display panel that faces the semi-transparent mirror layer includes a glass layer, and
wherein a refractive index of the semi-transparent mirror layer is greater than a refractive index of the glass layer of the display panel.

25. The apparatus of claim 18, wherein the semi-transparent mirror layer is doped with rare-earth material.

26. The apparatus of claim 18, wherein the side of the semi-transparent mirror layer opposite to the display panel is positioned to be irradiated by the hologram reconstruction light such that the incident angle prevents a total reflection of the hologram reconstruction light between the semi-transparent mirror layer and the glass layer of the display panel.

* * * * *

UNITED STATES PATENT AND TRADEMARK OFFICE
CERTIFICATE OF CORRECTION

| | |
|---|---|
| PATENT NO. | : 8,891,146 B2 |
| APPLICATION NO. | : 13/881731 |
| DATED | : November 18, 2014 |
| INVENTOR(S) | : Yamaichi |

It is certified that error appears in the above-identified patent and that said Letters Patent is hereby corrected as shown below:

In the Specification

In Column 1, Line 6, delete "371 application of" and insert -- U.S. national stage filing under 35 U.S.C. § 371 of --, therefor.

In Column 6, Line 64, delete "bottom side" and insert -- bottom side) --, therefor.

In Column 8, Line 2, delete "blocks." and insert -- blocks --, therefor.

Signed and Sealed this
Fourth Day of August, 2015

Michelle K. Lee
*Director of the United States Patent and Trademark Office*